US012665388B2

(12) United States Patent
Ashbrook et al.

(10) Patent No.: US 12,665,388 B2
(45) Date of Patent: Jun. 23, 2026

(54) LAYERED PULSE GENERATION FOR LASER DRIVER APPLICATION IN 3D SENSING

(71) Applicant: II-VI Delaware, Inc., Wilmington, DE (US)

(72) Inventors: Jonathan Ashbrook, Homer, IL (US); Steve Troyer, Savoy, CA (US); Gerald Dybsetter, Scotts Valley, CA (US); Brian Carey, Sunnyvalve, CA (US); Theron Jones, White Heath, IL (US)

(73) Assignee: II-VI DELAWARE, INC., Wilmington, DE (US)

( * ) Notice: Subject to any disclaimer, the term of this patent is extended or adjusted under 35 U.S.C. 154(b) by 889 days.

(21) Appl. No.: 17/647,378

(22) Filed: Jan. 7, 2022

(65) Prior Publication Data

US 2023/0223739 A1    Jul. 13, 2023

(51) Int. Cl.
*H01S 5/042* (2006.01)
*G01B 11/24* (2006.01)
(Continued)

(52) U.S. Cl.
CPC ......... *H01S 5/0428* (2013.01); *H03K 3/0315* (2013.01); *G01B 11/24* (2013.01); *H01S 5/183* (2013.01)

(58) Field of Classification Search
CPC .... H01S 5/0428; H01S 5/183; H01S 5/06226; H03K 3/0315; H03K 5/1534;
(Continued)

(56) References Cited

U.S. PATENT DOCUMENTS

| | | | | |
|---|---|---|---|---|
| 10,772,169 B1 * | 9/2020 | Qiu | ........................ | H05B 47/19 |
| 2003/0189465 A1 * | 10/2003 | Abadeer | ................ | H03K 5/133 |
| | | | | 331/57 |

(Continued)

FOREIGN PATENT DOCUMENTS

| | | | | |
|---|---|---|---|---|
| DE | 202011101272 U1 * | 2/2012 | ......... | H05B 33/0842 |
| DE | 102016116368 A1 * | 3/2018 | ........... | H01S 5/0428 |
| EP | 3064957 A1 * | 9/2016 | ............. | G01S 17/02 |

OTHER PUBLICATIONS

Halbritter translation.*
Waechter translation.*

*Primary Examiner* — Minsun O Harvey
*Assistant Examiner* — Alexander Ehrlich
(74) *Attorney, Agent, or Firm* — Blank Rome LLP

(57) ABSTRACT

A layered pulse generator for a vertical-cavity surface-emitting laser ("VCSEL") driver is disclosed consisting of three elements: a low-speed pulse generator, a high-speed pulse generator, and a pulse generator selector, all of which are on-chip with the VCSEL driver. By providing these elements on-chip, overall system power and complexity are reduced while allowing for significantly higher pulse train frequencies compared with known systems. The high-speed pulse generator is capable of generating pulses faster and with higher resolution than that of the low-speed pulse generator. The high-speed pulse generator uses multiple clock outputs, phase shifted, and synthesized into a single pulse waveform capable of wide-ranging frequencies, duty cycles and pulse counts.

16 Claims, 3 Drawing Sheets

(51) Int. Cl.
  *H01S 5/183*        (2006.01)
  *H03K 3/03*        (2006.01)

(58) Field of Classification Search
  CPC .................... H03K 5/131; H05B 45/00; H05B
                        45/30–335; G01S 17/10
  See application file for complete search history.

(56)                    References Cited

U.S. PATENT DOCUMENTS

2010/0134162 A1*   6/2010   Kondou ........... G01R 31/31727
                                              327/158
2018/0203102 A1*   7/2018   Wang .................... G01S 7/4815
2020/0185875 A1*   6/2020   Allouche ............. H01S 5/0428
2020/0412351 A1*  12/2020   Sheen ....................... G04F 5/00

* cited by examiner

LAYERED PULSE GENERATION FOR LASER DRIVER APPLICATION IN 3D SENSING

BACKGROUND OF THE DISCLOSURE

The disclosure is related to integrated circuits, and more particularly, to integrated circuits providing high-accuracy pulse train generation on-chip with a vertical-cavity surface-emitting laser ("VCSEL") array driver.

For 3D sensing applications, a VCSEL laser array is typically driven by a specially designed laser driver circuit. The laser driver circuit generates pulse trains that are delivered to the VCSEL laser array. Examples of such 3D sensing applications include facial identification and time of flight ("TOF") sensors within an optical autofocus feature for measuring an object's distance from the detector. The VCSEL drivers are typically pulsed to reduce the chance of eye damage that can be caused by prolonged exposure to laser emissions.

The circuit typically includes a driver and a pulse generator. The driver turns the laser array on or off. The pulse generator produces a pulse train or burst that is required for the given application. This pulse train will generally be a burst of pulses and may be repeated at some interval. The pulse train can be defined by three basic characteristics: pulse high time, pulse low time, and number of pulses. FIG. 5 depicts a pulse train for a 3-pulse burst, as known in the prior art. The characteristics of the pulse train may change depending upon the application.

SUMMARY OF THE DISCLOSURE

A layered pulse generator is described, consisting of a low-speed pulse generator, a high-speed pulse generator, and a pulse generator selector, all on-chip with the VCSEL driver. The high-speed and low-speed pulse generators can each produce a pulse train in response to a trigger from the pulse generator selector. The two generators are used mutually exclusive of each other. The high-speed pulse generator is used for pulses that are faster than the low-speed generator's capability. The low-speed pulse generator's minimum pulse width is determined by a single phase of a low-speed clock, such as that from a CPU. For longer pulses that are within the low-speed pulse generator's capability, the low-speed pulse generator will be used. The high-speed pulse generator includes a clock generator that produces multiple phase clock outputs, and a configurable pulse synthesizer that combines the multiple clock phases into a single pulse waveform. Use of the low-speed generator requires lower power consumption. The result is a flexible and highly configurable pulse generator for synthesizing pulse waveforms with widely ranging frequencies, duty cycles and pulse counts while minimizing overall power consumption. Alternatively, the high-speed pulse generator may be implemented using either analog or digital circuit techniques.

The disclosure allows for significantly higher pulse train frequencies (e.g., up to about 1 GHz), higher accuracy pulses and lower power consumption compared with the prior art. Since the pulse generator is on-chip, there is no need for complex chip-to-chip pulse generation and frequencies are not limited by the capabilities of chip-to-chip interfaces. Moreover, the invention includes two different pulse generators on-chip; a low-speed pulse generator and a high-speed pulse generator. Depending on the type and frequency of the required pulse train, one of the generators may be activated while the other is powered down for additional power savings. The inherent noise issues associated with the VCSEL driver are overcome by using circuit design techniques such as star ground topology and decoupling capacitors to isolate the pulse generators from the driver. The layered pulse generator of the present disclosure may be used in 3D sensing applications.

DETAILED DESCRIPTION OF THE DISCLOSURE

Figure 1:
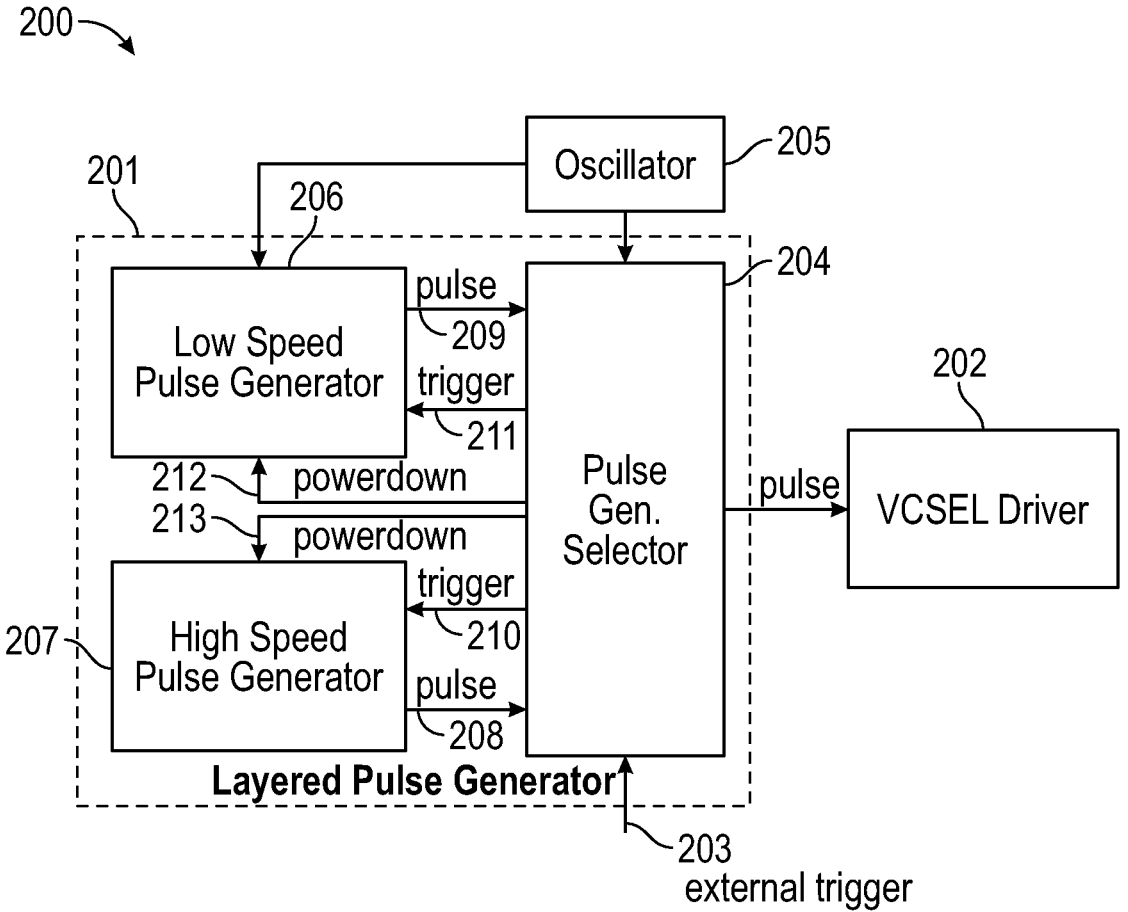
FIG. 1 depicts a block diagram of a layered pulse generator, in accordance with an exemplary embodiment of the disclosure.

Referring now to the figures in which like reference designators refer to like elements, FIG. 1 shows a block diagram of a layered pulse generator circuit 201 located on-chip with a VCSEL driver circuit 202. The layered pulse generator circuit 201 may be implemented in, for example, a 3D sensing application. An external trigger signal 203 is received by a pulse generator selector 204 for initiating pulse train generation to the VCSEL driver 202. Depending upon the type of pulse train (e.g., high pulse width, low pulse width, pulse burst count, duty cycle, and frequency of bursts) required for a given application, the pulse generator selector 204 selects one of the low-speed pulse generator 206 or the high-speed pulse generator 207 by sending a respective trigger signal 211, 210 to the selected pulse generator 206, 207. The pulse trigger signal 211, 210 also begins each burst of pulses 209, 208. The unused pulse generator will be powered down to reduce system power by the pulse generator selector 204 via a power down signal 212, 213. The minimum interval between pulse trains will be bounded by the oscillator 205 frequency.

The pulse generator selector 204 also routes the selected pulse train to the VCSEL driver 202. The electrical characteristics of the pulse train going to the VCSEL driver 202 will be the same, regardless of which pulse generator 206, 207 produced the pulse train. The pulse generator selector 204 may receive an external trigger 203 from a host chip using, for example, a CMOS pulse, as indicated in FIG. 1. Alternatively, for the greatest power savings, the trigger 203 may be generated on-chip and requested using known protocols such as serial peripheral interface ("SPI") or I-squared-C ("I²C") management interface.

While it is generally envisioned that the pulse generator selector 204 is implemented in hardware, it is possible that part of this functionality could be accomplished with software in a microcontroller. However, because the microcontroller is normally managing multiple system functions, prioritization of the functions could potentially delay the selection of a pulse generator by a number of clock cycles. Thus, implementing the pulse generator selector 204 through software is more acceptable for longer pulses, where some pulse width and burst frequency variation is acceptable. Further, where the pulse generator selector functionality is implemented in software, both the low-speed and high-speed pulse generators 206, 207 may be powered down.

Generally speaking, there are two regimes of pulse trains: fast pulses and slow pulses. In accordance with an exemplary embodiment, slow pulses are generated by the clocked low-speed pulse generator 206 and fast pulses are generated by the high-speed pulse generator 207. While either pulse train may be generated by a clocked digital circuit, or an asynchronous analog circuit, the clocked digital circuit will have an accuracy similar to the accuracy of the oscillator 205 that drives it. Moreover, the minimum pulse width of a pulse generated by a clocked digital circuit is dictated by the frequency of the oscillator.

By contrast, the minimum pulse width and accuracy generated by an asynchronous analog circuit will be self-determined by the circuit elements and the semiconductor process. The circuit can be externally trimmed to improve the accuracy; however, it is generally difficult to trim an analog circuit to have acceptable accuracy across a wide range of pulse widths and pulse counts.

To create the most flexibility with generating fast pulse trains, the high-speed pulse generator 207 is preferably implemented with a clock generator that produces multi-phase clock outputs, and a configurable pulse synthesizer that combines the multiple clock phases into a single pulse waveform. By synthesizing the pulse waveform from multiple clock phases, the pulse period and duty cycle can be controlled to a resolution as small as the delay between subsequent phases, giving fine-grained control and repeatability with a simple, constant frequency oscillator.

Figure 2:
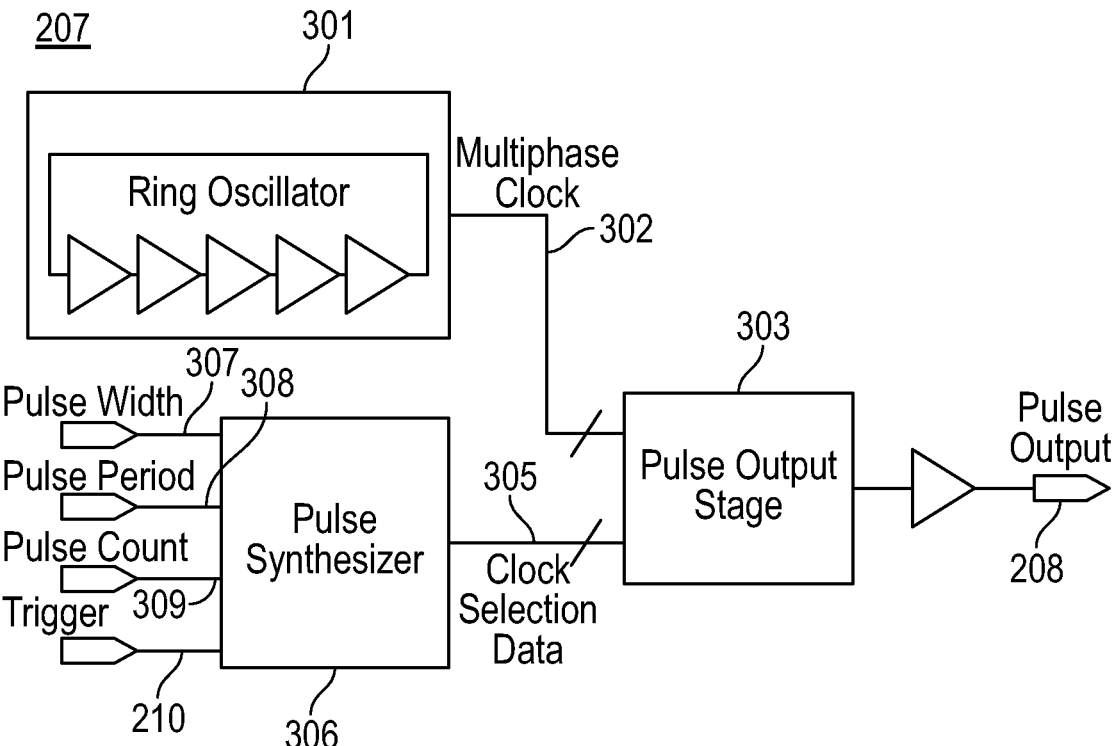
FIG. 2 depicts a block diagram of a high-speed pulse generator used in the layered pulse generator of FIG. 1, in accordance with an exemplary embodiment of the disclosure.

Referring now to FIG. 2, a block diagram of a high-speed pulse generator 207 of FIG. 1 is shown, in accordance with an exemplary embodiment of the disclosure. The high-speed pulse generator 207 provides high-accuracy, finely controllable and repeatable pulse waveforms on chip, without requiring external pulse generation circuitry and enabling higher speed than is supported by the external interface.

To enable pulse waveform synthesis, oscillator 301 provides a multi-phase clock, with clock phases evenly spaced in time and spanning the full clock period. The oscillator frequency determines the maximum pulse frequency, and the phase spacing determines the pulse configuration resolution. For precise frequency control and phase spacing, the oscillator 301 can be combined with a phase-locked loop (PLL) or delay locked loop (DLL) to generate evenly-spaced phases.

The noise effects inherently associated with the VCSEL driver may be greatly reduced with a combination of circuit design techniques, including star ground topology and decoupling capacitors. After the circuit designer carefully analyzes how and where driver noise is propagated on the chip, the noise may be isolated from the operation of the pulse generators, including the multi-phase high-speed clock, by placing decoupling capacitors in strategic locations depending on where and how the VCSEL driver noise is propagated on the particular chip layout. To further reduce the noise effects of the driver, star ground topology may also be used in which the ground lines of various modules are kept apart from each other and only meet once at a single point. In this way, all of the numerous modules share the same ground reference, however noise propagating in one module of the chip will not travel to another module of the chip.

Figure 3:
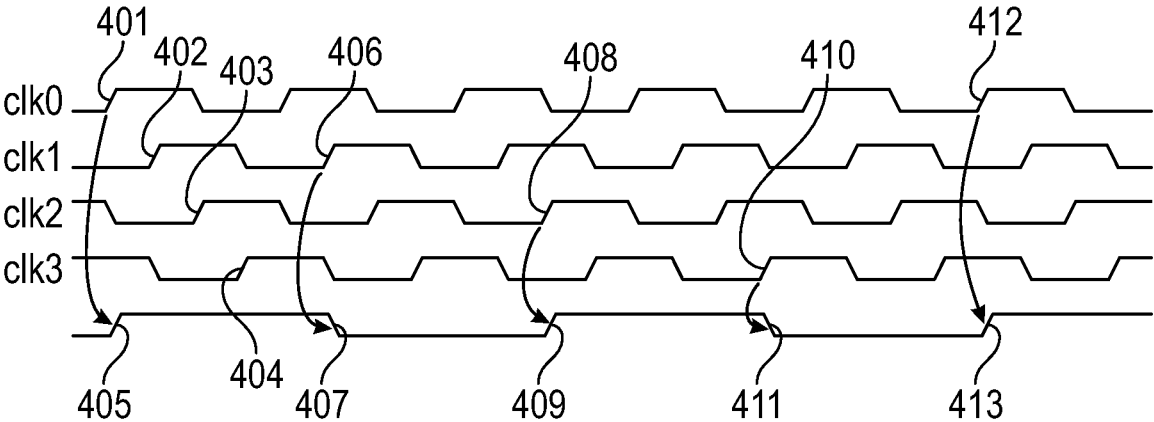
FIG. 3 depicts a pulse synthesis waveform generated with the high-speed pulse generator of FIG. 2, in accordance with an exemplary embodiment of the disclosure.

Referring to FIG. 3, a pulse synthesis waveform is shown where four clocks clk0, clk1, clk2 and clk3 are phase shifted to create a single synthesized waveform, in accordance with an exemplary embodiment of the disclosure. In this example, spacing of 200 ps between phases was chosen, implying an 800 ps period (1.25 GHz) for each clock. It should be noted, however, that this is arbitrary, and any phase separation/overall period could be chosen. The rising edge of clk0 401 corresponds with the rising edge 405 of the first pulse of the synthesized pulse waveform. After rising edges of clk1, clk2 and clk3, respectively 402, 403, 404, the rising edge 406 of the second pulse of clk1 corresponds with the falling edge 407 of the first pulse of the synthesized pulse waveform.

The rising edge 409 of the second pulse of the synthesized waveform corresponds with rising edge 408 of clk2. And the falling edge 411 of the second pulse of the synthesized waveform corresponds with rising edge 410 of clk3, and so on. The ability to select specific rising or falling edges of each of the phase shifted clock waveforms enables great flexibility in generating a synthesized waveform to meet the demands of many different VCSEL array driver applications. The pattern is depicted below in Table 1.

TABLE 1

| Edge | Period | Phase | Time |
|------|--------|-------|--------|
| Rise | 0 | 0 | 0 |
| Fall | 1 | 1 | 1.0 ns |
| Rise | 2 | 2 | 2.0 ns |
| Fall | 3 | 3 | 3.0 ns |

In another example, where ten different clocks are used to enable 500 MHz pulses with a configuration resolution of 100 ps, the oscillator needs to have a frequency of 1 GHz, and 10 equally spaced clock phases, spaced 100 ps apart.

Referring again to FIG. 2, a pulse synthesizer 306 computes the necessary clock phases from the oscillator 301 and transmits this information to the pulse output stage 303 to produce a pulse waveform by selectively combining the clock phases into a pulse output. The synthesizer 306 can have various inputs providing configuration settings, such as pulse frequency, duty cycle, burst settings (number of pulses per burst and triggering modes).

In this exemplary embodiment, pulse synthesizer 306 receives data regarding the required pulse train, including pulse width 307, pulse period 308 and pulse count 309. Upon receipt of input trigger 210, pulse synthesizer 306 transmits clock selection data 305 to pulse output stage 303, based on the required pulse train parameters. In other words, the pulse synthesizer 306 selects the precise clock pulses of the phase-shifted clocks to generate a synthesized pulse waveform meeting the required parameters for the pulse train.

In an exemplary implementation, with a 1 GHz oscillator and 100 ps phase spacing, the synthesizer can work in multiple scenarios:
  i) For a 500 MHz, 50% duty-cycle pulse, the output 208 is simply a single clock phase with the frequency divided by two, with a simple frequency divider.
  ii) For a 100 MHz, 40% duty-cycle pulse, a counter can be used to count 6 cycles of the clock for the low part of the pulse, 4 cycles of the clock for the high part of the pulse, and repeated as needed.

For pulses that are non-integer multiples of the oscillator clock period, multiple phases can be used. For example, for a 250 MHz pulse with a 44% duty cycle, the pulse width will be 1. Ins and the total period will be 2.5 ns. This can be achieved by starting the pulse on the 1st clock phase (clk0, t=0) and stopping the pulse on the 2nd clock phase (clk1), one period later (t=1 ns+100 ps=1.1 ns). The next pulse will begin on the 6th clock phase (clk5) a cycle later (t=2 ns+500 ps=2.5 ns). The pattern is depicted below in Table 2:

TABLE 2

| Edge | Period | Phase | time |
| --- | --- | --- | --- |
| Rise | 0 | 0 | 0 |
| Fall | 1 | 1 | 1.1 ns |
| Rise | 2 | 5 | 2.5 ns |
| Fall | 3 | 6 | 3.6 ns |
| Rise | 5 | 0 | 5 ns |
| Fall | 6 | 1 | 6.1 ns |

Figure 4:
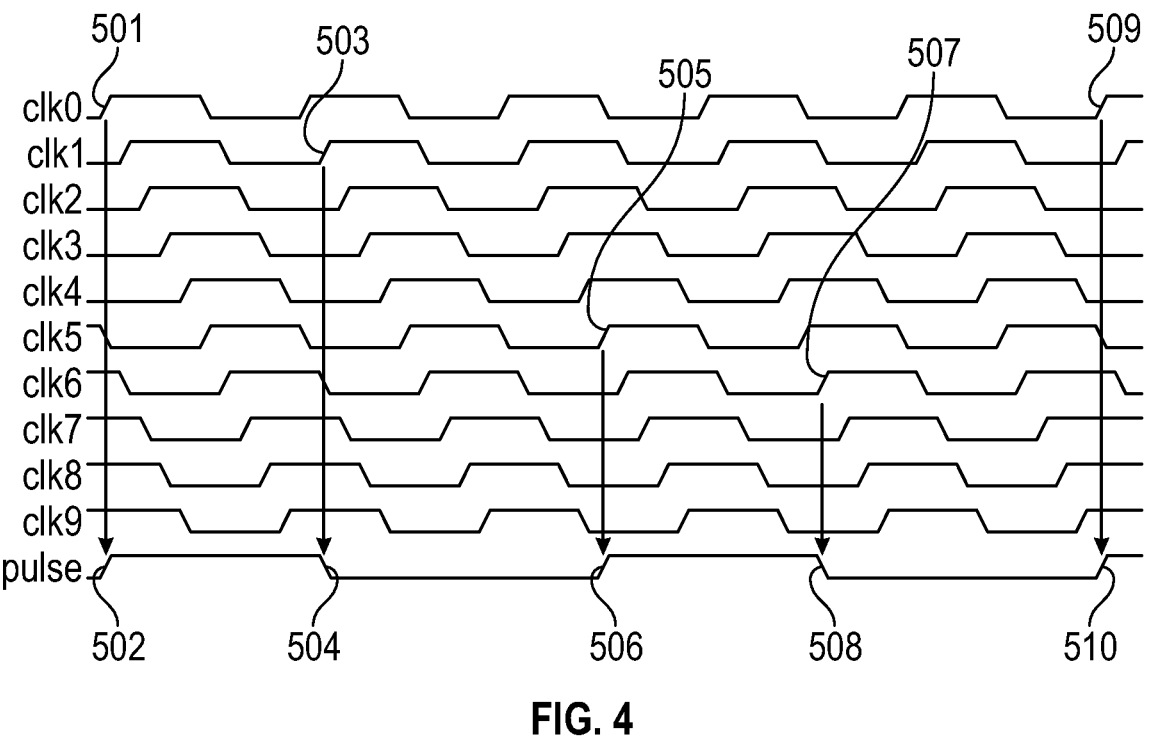
FIG. 4 depicts pulse synthesis waveform generated with the high-speed pulse generator of FIG. 2, in accordance with another exemplary embodiment of the disclosure.
Figure 5:
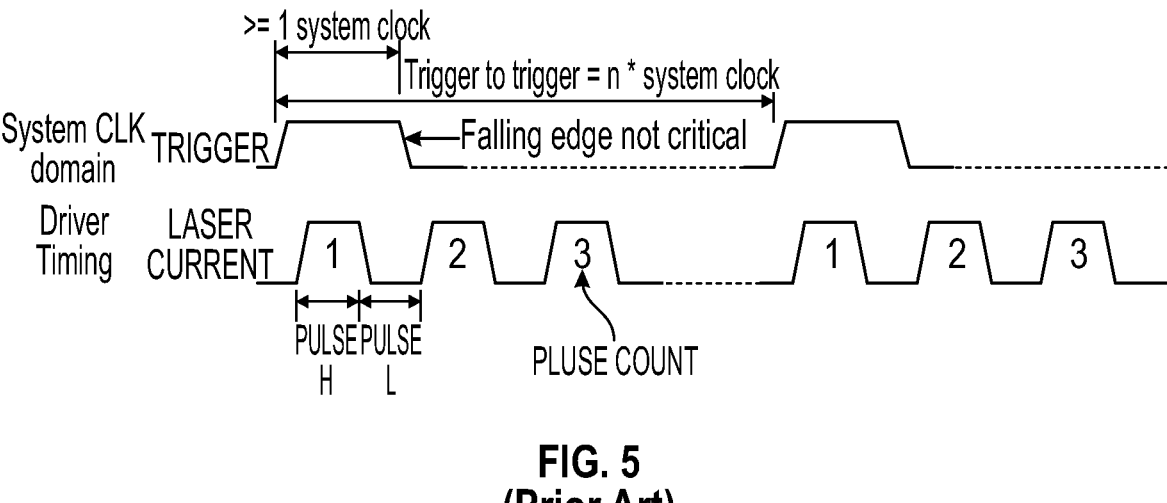
FIG. 5 depicts a three-pulse burst, as known in the art.

FIG. 4 illustrates a pulse synthesis waveform corresponding to the 10 phase-shifted clock output in Table 2. Ten clocks clk0-9 are phase shifted to create a single synthesized waveform, in accordance with an exemplary embodiment of the disclosure. The rising edge of clk0 501 corresponds with the rising edge 502 of the first pulse of the synthesized pulse waveform. The rising edge of clk1 503 corresponds with the falling edge 504 of the synthesized pulse waveform. Then, rising edge of clk5 505 corresponds to the next rising edge 506 of the synthesized pulse waveform and rising edge of clk6 507 corresponds to falling edge 508 of the synthesized pulse waveform, and so on.

This general pattern can be applied to produce arbitrary combinations of pulse period and pulse width with step-sizes of 100 ps by appropriately choosing the incrementing of period and phase to produce the desired result. In this manner, the pulse train is not limited to the system clock and because the pulse generation is performed on-chip, communication protocol limitations when transmitting high frequency waveforms chip-to-chip are eliminated. The disclosure is also not limited to any specific number of clocks nor is it limited to any specific phase shift.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. A circuit, comprising:
a VCSEL driver;
a pulse generator selector coupled to the VCSEL driver, the pulse generator selector adapted to receive a trigger signal, the trigger signal including a characteristic of a pulse train and being separate from the pulse train;
a first pulse generator coupled to the pulse generator selector;
a second pulse generator coupled to the pulse generator selector, the second pulse generator being a high-speed pulse generator adapted to provide the pulse train at a higher frequency than the first pulse generator, wherein;
the pulse generator selector is configured to, upon receiving the trigger signal, select one of the first and second pulse generators based upon the trigger signal and the characteristic to provide the pulse train to the VCSEL driver,
wherein the pulse generator selector is electrically connected between the first pulse generator and the VCSEL driver, the pulse generator selector is electrically connected between the second pulse generator and the VCSEL driver, and the pulse generator selector is adapted to selectively route the pulse train from the first pulse generator through the pulse generator selector to the VCSEL driver in a first selected configuration and selectively route the pulse train from the second pulse generator through the pulse generator selector to the VCSEL driver in a second selected configuration, the first and second selected configurations being different,
wherein the pulse generator selector is further configured to send a power-down signal to the second pulse generator in the first selected configuration and to send a power-down signal to the first pulse generator in the second selected configuration.

2. The circuit of claim 1, wherein the first pulse generator is a low-speed pulse generator adapted to generate the pulse train at a maximum speed lower than a maximum speed of the second pulse generator.

3. The circuit of claim 1, wherein an unselected one of the first and second pulse generators is configured to be powered down at a first time slot.

4. The circuit of claim 1, wherein the pulse generator selector is configured to generate a pulse for driving the VCSEL driver.

5. The circuit of claim 4, wherein the first and second pulse generators are configured to be powered down when the pulse generator selector generates the pulse for driving the VCSEL driver.

6. The circuit of claim 1, wherein the high-speed pulse generator comprises:
an oscillator adapted to generate multiple phase-shifted clocks; and
a pulse synthesizer adapted to select a plurality of clock pulses from the multiple phase-shifted clocks for generating a pulse synthesis waveform.

7. The circuit of claim 6, wherein the pulse synthesizer selects the plurality of clock pulses from the multiple phase-shifted clocks based on data regarding at least one of pulse width, pulse period, and pulse count.

8. The circuit of claim 6, wherein the oscillator is a ring oscillator.

9. The circuit of claim 6, wherein the pulse synthesizer selects the plurality of clock pulses from the multiple phase-shifted clocks based on at least one configuration setting, the at least one configuration setting including one or more of a pulse frequency, a duty cycle, a number of pulses per burst, a pulse width, a pulse period, a pulse count, and a triggering mode.

10. The circuit of claim 1, wherein the trigger signal is one of a SPI or I2C management interface.

11. The circuit of claim 1, wherein the trigger signal is received from a host chip using a digital pulse.

12. The circuit of claim 1, wherein the circuit is included in a time of flight sensor.

13. The circuit of claim 1, wherein the second pulse generator further includes:
an oscillator adapted to generate multiple phase-shifted clocks; and a pulse synthesizer adapted to select a plurality of clock pulses from the multiple phase-shifted clocks for generating the pulse train of the second pulse generator, wherein the plurality of clock pulses are selected based on pre-determined parameters for the pulse synthesis waveform, including at least one of pulse width, pulse period, and pulse count.

14. The circuit of claim 13, wherein the circuit is included in a time of flight sensor.

15. The circuit of claim 1, wherein the characteristic includes at least one of: a pulse width, a pulse burst count, a duty cycle, and a pulse frequency.

16. The circuit of claim 15, wherein the characteristic includes the pulse frequency.

* * * * *